(12) United States Patent
Connor et al.

(10) Patent No.: US 10,984,957 B1
(45) Date of Patent: Apr. 20, 2021

(54) PRINTED CIRCUIT BOARD EMBEDDED CAPACITOR

(71) Applicant: International Business Machines Corporation, Armonk, NY (US)

(72) Inventors: Samuel R. Connor, Apex, NC (US); Stuart Brett Benefield, Durham, NC (US); Matthew Doyle, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/701,815

(22) Filed: Dec. 3, 2019

(51) Int. Cl.
| | |
|---|---|
| *H05K 1/00* | (2006.01) |
| *H05K 1/02* | (2006.01) |
| *H05K 1/14* | (2006.01) |
| *H05K 1/18* | (2006.01) |
| *H05K 3/22* | (2006.01) |
| *H05K 3/32* | (2006.01) |
| *H05K 3/36* | (2006.01) |
| *H05K 3/42* | (2006.01) |
| *H01G 4/005* | (2006.01) |
| *H01G 4/02* | (2006.01) |
| *H01G 4/06* | (2006.01) |
| *H01G 4/012* | (2006.01) |
| *H01G 4/12* | (2006.01) |

(Continued)

(52) U.S. Cl.
CPC ............... *H01G 4/35* (2013.01); *H01G 4/005* (2013.01); *H01G 4/06* (2013.01); *H01G 4/224* (2013.01); *H01G 4/228* (2013.01); *H05K 1/112* (2013.01); *H05K 1/184* (2013.01); *H05K 3/0047* (2013.01); *H05K 2201/10015* (2013.01)

(58) Field of Classification Search
CPC .. H05K 1/00; H05K 1/02; H05K 1/14; H05K 1/18; H05K 3/22; H05K 3/32; H05K 3/36; H05K 3/42; H01G 4/005; H01G 4/02; H01G 4/06; H01G 4/012; H01G 4/12; H01G 4/30; H01G 4/33; H01G 4/35; H01G 4/38; H01G 4/228; H01G 4/232; H01G 4/248
USPC ..... 174/262, 250, 260; 361/301.4, 302, 303, 361/306.1, 306.2, 306.3, 311, 313, 321.3, 361/738, 781
See application file for complete search history.

(56) References Cited

U.S. PATENT DOCUMENTS

| | | | |
|---|---|---|---|
| 5,736,807 A | * | 4/1998 | Hakamata ............. H01L 41/107 310/359 |
| 6,346,743 B1 | | 2/2002 | Figueroa et al. |

(Continued)

FOREIGN PATENT DOCUMENTS

KR        100757908 B1      9/2007

*Primary Examiner* — Xiaoliang Chen
(74) *Attorney, Agent, or Firm* — Peter J. Edwards

(57) ABSTRACT

A capacitor comprises a housing and a first stack of parallel plates within the housing. A first plate and a second plate in the first stack are capacitively coupled. The capacitor comprises a second stack of parallel plates within the housing. A third plate and a fourth plate in the stack are capacitively coupled. The capacitor also comprises a first input electrode and a second input electrode. The capacitor also comprises a first output electrode and a second output electrode on a side surface of the capacitor. The capacitor also comprises a dielectric material located between each plate in the first stack and the second stack. The first stack is not capacitively coupled with the second stack.

5 Claims, 6 Drawing Sheets

(51) Int. Cl.
  *H01G 4/30*     (2006.01)
  *H01G 4/33*     (2006.01)
  *H01G 4/35*     (2006.01)
  *H01G 4/38*     (2006.01)
  *H01G 4/228*    (2006.01)
  *H01G 4/232*    (2006.01)
  *H01G 4/248*    (2006.01)
  *H01G 4/224*    (2006.01)
  *H05K 1/11*     (2006.01)
  *H05K 3/00*     (2006.01)

(56) References Cited

U.S. PATENT DOCUMENTS

| | | | | |
|---|---|---|---|---|
| 6,490,148 | B1* | 12/2002 | Allen | A61N 1/3754 361/302 |
| 6,542,352 | B1* | 4/2003 | Devoe | H01G 4/228 361/306.1 |
| 6,621,012 | B2 | 9/2003 | Crockett et al. | |
| 6,952,049 | B1 | 10/2005 | Ogawa et al. | |
| 7,791,896 | B1 | 9/2010 | Fan et al. | |
| 7,936,567 | B2 | 5/2011 | Takashima et al. | |
| 8,198,547 | B2 | 6/2012 | Hardin et al. | |
| 8,198,548 | B2 | 6/2012 | Hardin et al. | |
| 9,502,490 | B2 | 11/2016 | We et al. | |
| 9,716,137 | B1* | 7/2017 | Hu | H01L 27/11582 |
| 9,728,337 | B2* | 8/2017 | Lamy | H01L 28/91 |
| 9,986,633 | B2 | 5/2018 | Shan | |
| 2002/0027484 | A1* | 3/2002 | Stevenson | A61N 1/3754 333/182 |
| 2005/0122662 | A1* | 6/2005 | Hayashi | H01G 4/12 361/306.3 |
| 2006/0245142 | A1* | 11/2006 | Hayashi | H01G 4/30 361/306.3 |
| 2006/0285271 | A1* | 12/2006 | Lee | H01G 4/30 361/303 |
| 2007/0109717 | A1* | 5/2007 | Lee | H01G 4/232 361/303 |
| 2007/0121275 | A1* | 5/2007 | Takashima | H01G 4/30 361/311 |
| 2008/0037199 | A1* | 2/2008 | Fukudome | H01G 4/232 361/321.3 |
| 2008/0043400 | A1* | 2/2008 | Fukudome | H05K 1/0231 361/301.4 |
| 2008/0158773 | A1* | 7/2008 | Lee | H01G 4/232 361/306.3 |
| 2008/0202799 | A1 | 8/2008 | Graydon et al. | |
| 2008/0225463 | A1* | 9/2008 | Takashima | H01G 4/30 361/306.3 |
| 2009/0059469 | A1* | 3/2009 | Lee | H01G 4/385 361/306.2 |
| 2009/0213525 | A1* | 8/2009 | Lee | H01G 4/005 361/303 |
| 2009/0225492 | A1* | 9/2009 | Lee | H01G 4/012 361/303 |
| 2009/0244803 | A1* | 10/2009 | Lee | H01G 4/30 361/301.4 |
| 2012/0181658 | A1* | 7/2012 | Mohammed | H01L 23/481 257/532 |
| 2012/0224333 | A1* | 9/2012 | Abawi | H05K 1/162 361/748 |
| 2015/0083477 | A1* | 3/2015 | Lee | H01G 4/232 174/260 |
| 2016/0309593 | A1 | 10/2016 | Hiroshima et al. | |
| 2018/0337054 | A1* | 11/2018 | Sung | H01L 29/40114 |
| 2019/0006107 | A1* | 1/2019 | Kim | H01G 4/12 |
| 2019/0074137 | A1* | 3/2019 | Lee | H05K 1/181 |
| 2019/0244759 | A1* | 8/2019 | Hatanaka | H01G 4/232 |

\* cited by examiner

PRINTED CIRCUIT BOARD EMBEDDED CAPACITOR

BACKGROUND

The present disclosure relates to printed-circuit-board components, and more specifically, to capacitors for printed circuit boards.

Typical printed circuit boards are composed of several layers of a non-conductive substrate. Electrical wiring and some other electrical components can be placed on the outer surface of the printed circuit board and between the layers of the non-conductive substrate. This results in several wiring layers on the surfaces and interior of the printed circuit board. Electrical components added to the printed circuit board are typically connected to each other using copper wires that are placed on (or in) these wiring layers.

Some electrical components of a printed circuit board are configured to accept alternating current (sometimes referred to herein as "AC") signals, whereas some electrical components are configured to accept direct current (sometimes referred to herein as "DC") signals, or a mixture of both AC and DC signals. Electrical components (sometimes referred to herein simply as "components") that are configured to accept AC signals typically require those signals to pass through an AC capacitor before accepting the signal to remove DC portions of the signal.

SUMMARY

Some embodiments of the present disclosure can be illustrated as a capacitor comprising a housing and a first stack of parallel plates within the housing. A first plate and a second plate in the stack may be capacitively coupled. The capacitor may also comprise a second stack of parallel plates within the housing. A third plate and a fourth plate in the second stack may be capacitively coupled. The capacitor may comprise a first input electrode and a second input electrode. The capacitor may also comprise a first output electrode and a second output electrode on a side surface of the capacitor. The capacitor may also comprise a dielectric material located between each plate in the first stack and second stack. The first stack may not be capacitively coupled with the second stack.

Some embodiments of the present disclosure can also be illustrated as a system comprising a printed circuit board. The system may also comprise a surface-mount component that is attached to a surface of the printed circuit board. The system may also comprise a hole drilled into the printed circuit board and a capacitor inserted into the hole. The capacitor may comprise a housing. The capacitor may also comprise a first stack of parallel plates within the housing. A first plate and a second plate in the first stack are capacitively coupled. The capacitor may also comprise a second stack of parallel plates within the housing. A third plate and a fourth plate in the second stack may be capacitively coupled. The capacitor may also comprise a first input electrode and a second input electrode. The capacitor may also comprise a first output electrode and a second output electrode on a side surface of the capacitor. The capacitor also comprises a dielectric material located between each plate in the first stack and second stack. The first stack may not be capacitively coupled with the second stack.

Some embodiments of the present disclosure can also be illustrated as a method comprising inputting a first signal from a surface-mount component into a first input electrode on a capacitor. The capacitor may be located in a hole drilled into the circuit board. The method may also comprise conducing the first signal from the first input electrode to a first stack of coupled plates. The first stack of coupled plates may be interdigitated. The method may also comprise conducting the first signal from the first stack of coupled plates to an output electrode located on a first side surface of the capacitor. Finally, the method may comprise conducting the first signal to a first stripline wire in an inner layer of the printed circuit board.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
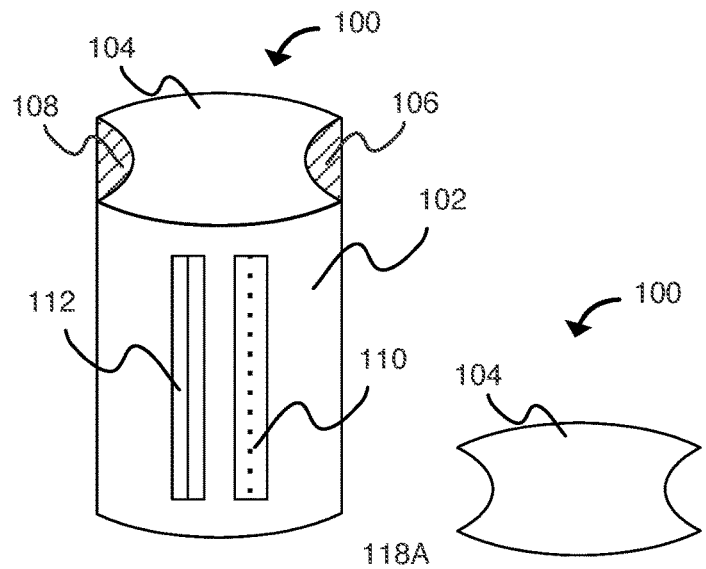
FIG. 1A depicts a perspective view of an example embodiment of a capacitor that may be embedded between two vias below a surface-mount component, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to printed-circuit-board components, and more specifically, to capacitors for printed circuit boards. While the present disclosure is not necessarily limited to such applications, various aspects of the disclosure may be appreciated through a discussion of various examples using this context.

Electrical components added to printed circuit boards (sometimes referred to herein as "PCBs") may be configured to accept direct current (sometimes referred to herein as "DC") signals, alternating current (sometimes referred to herein as "AC") signals, or AC signals with a DC signal bias. While signals that include a DC bias can be useful in situations where avoiding an average of 0 volts is beneficial, in some instances DC bias can be detrimental. For example, in some use cases input-output buses (e.g., peripheral component interconnect express) require that DC bias be removed before routing to other circuit boards or exiting a system on a cable to avoid signal-integrity issues. Removing DC bias from a signal typically requires an AC coupled capacitor.

Typical AC coupled capacitors (also referred to herein simply as "capacitors") are relatively large components when compared to many other typical components in or on a PCB. For that reason, capacitors typically are placed on the surface of PCBs, rather than embedded within the internal layers of the PCB. While surface mounting capacitors can increase the flexibility of wiring in the inner layers of the PCB (for example, by avoiding a large physical obstacle within the PCB), it can also lead to significant wiring inefficiencies.

For example, because of the relatively large surface area a capacitor can occupy on a PCB surface, the surface of the PCB underneath and immediately surrounding the capacitor may become unsuitable for wiring. Particularly for PCBs with a large number of capacitors, this can severely limit the amount of the PCB surface that can be used for connecting the components of the PCB. Further, the wiring between some components can carry signals of particular frequencies or amplitudes that may result in high amounts of incidental emissions (e.g., electromagnetic radiation from the wire into the air surrounding the PCB).

In some use cases, therefore, the wiring between many components occurs throughout the inner layers of the PCB (also referred to herein as the inner wiring layers). For example, a common method of wiring through the inner wiring layers is referred to as stripline wiring, in which one or more flat strips of copper act as a wire over which a signal may travel.

However, wiring between surface-mount components and surface-mount capacitors through the inner layers of a PCB can, in some use cases, cause significant electrical problems. For example, routing a signal from an output component into the PCB, out of the PCB to the PCB surface (to the capacitor) capacitor, out of the capacitor and into the PCB, and out of the PCB and into an input component can involve several wiring turns. Each of these wiring turns may result in a portion of the signal propagating in an unintended direction, which may cause the signal reflecting and arriving at unintended times, weak signals, interference, or other signal-integrity issues.

These signal-integrity issues can be particularly prevalent when a signal exits a via. A via is a term for a hole drilled in a PCB that can act as an electrical conduit between components on the PCB surface and the inner wiring layers. Vias are typically cylindrically shaped, and the wall of the PCB surrounding the hole (in other words, the side of the hole) is typically plated with an electrically conductive metal. A signal may enter the via from a surface-mount component at the board's surface, travel down the via barrel, and turn into an inner-layer wire that contact the via barrel somewhere between the two PCB surfaces (in other words, between the two openings of the via). However, in these situations, some portion of the signal may continue travelling down the via barrel rather than transferring to the wire and may reflect back through the via barrel upon reaching the end of the via. Because typical use cases may require a signal to navigate through three separate vias to pass through a surface-mount capacitor (one via to transition from the surface-mount input component to an internal wiring later, one via to transition from the internal wiring layer to the surface layer, and one via to transition from the surface-mount capacitor back to an internal-wiring layer), these unintended signal detours can have additive effects.

The impact to signal integrity that results from these unintended signal detours can vary based on, for example, the layer of the PCB in which the wire contacting the via barrel is embedded. However, in many cases the overall physical design of a PCB may place significant restrictions on the location of this wire (i.e., the wiring layer), and in some instances the only layers that are available may result in particularly significant signal-integrity issues.

For the above and other reasons, it may be beneficial to embed a capacitor in a PCB, rather than mount the capacitor on the surface. However, embedding a capacitor in a PCB also can have negative consequences. As discussed earlier, capacitors are relatively large, and thus an embedded capacitor may occupy a significant amount of the surface area of several inner layers, which may place significant restrictions on internal wiring design. This can result in significant design and manufacturability challenges (and costs) that are often not worth the benefits that can result from not mounting the capacitor on the surface of the PCB.

These negative consequences may be exacerbated in use cases with differential pairs of signals (i.e., a signal that is actually composed of two opposite AC signals carried on two wires). Differential pairs of signals are common in components that are sensitive to signal noise caused by electromagnetic interference (high-speed connectors, for example). This is because the differential pairs carry two opposite values, and those values should be affected very similarly by electromagnetic interference. Thus, the intended signal can be calculated by the difference between those values of the two differential signals even if they are shifted by interference.

However, utilizing differential pairs of signals requires two carriers (e.g., wires) to carry a single input rather than one carrier, which can increase the space required for those carriers. In the case of a capacitor, this can actually require two capacitors for the same input, or a very large capacitor for one input. Thus, in many use cases, embedding a capacitor in a PCB can cause significant challenges.

Finally, even when a capacitor can be embedded within the PCB, it results in few benefits if the signals still need to transition to the surface of the PCB to enter and exit the capacitor. In other words, if a signal travelling in an inner wire of the PCB needs to transition to the surface of the PCB to enter a capacitor, the same amount of wiring turns (and thus potential redirections, reflections, etc.) may result regardless of whether the capacitor is located on the PCB surface or embedded within the PCB.

Some embodiments of the present disclosure are directed to a capacitor that can be inserted into a PCB between two vias. In some such embodiments, the capacitor may be designed to be inserted between two vias that are already needed for other reasons, and therefore the overall amount of vias may not increase. This may have wiring-design benefits both in the internal layers and on the PCB surface.

In some embodiments, the capacitor may be a quasi-cylindrical capacitor that is shaped to fit between two vias. For example, the capacitor may be cylindrically shaped aside from having two concave surfaces (also referred to herein as concave "sides") that follow the approximate curve of the curve of corresponding vias. The concave sides may interface with the barrel of the vias.

In some embodiments, the capacitor may contain two sets of quasi-semicircular parallel plates that are arranged in two stacks that are next to each other. The plates may be separated by a substrate with a high dielectric constant. Each of the plates in each stack, therefore, may be capacitively coupled to the other plates in the stack, but not capacitively coupled to any plate in the other stack. In this way, the capacitor may be capable of carrying two differentiated signals in one footprint. Further, because each signal stack is composed of quasi-semicircular plates, the capacitor may maintain its overall quasi-cylindrical shape. This may help to reduce the overall footprint of the capacitor and allow the capacitor to fit between two vias.

In some embodiments, the capacitor may contain a set of conductors on the side wall of the capacitor housing. Each conductor may be connected to a different stack of semicircular plates and may therefore serve as outputs of the capacitors. Further, because the stacked plates of the capacitor, in some embodiments, share the capacitor's charge, each output could be connected to any plate in the corresponding stack. In other words, because the charge of a capacitor exists throughout the stack of plates, the output of the capacitor could be designed to transition a signal to a wire in any internal layer of the PCB and the charge of the capacitor would flow from the plates to the wire. This would prevent indirect routing, reflections, and other detriments normally associated with turning signals, and could allow for significant wiring flexibility in some use cases.

In some embodiments, the capacitor may take the form of an interdigitated capacitor. In an interdigitated capacitor, two or more sets of plates in a single stack of parallel plates are connected to a corresponding common conductor, causing each set of plates within the stack (also referred to as "fingers") to act as a single plate with very large surface area (and thus high capacitance). When the plates in the stack are alternated (each pair of plates of one set is separated by a plate from the other set), the plates from one set becomes capacitively coupled with the other set, and thus the two sets of plates act as two large plates that are capacitively coupled. Using an interdigitated capacitor may be beneficial because the inputs and outputs of the capacitor could be located on any internal PCB layer to which the common conductor connects. This may enable the input to a capacitor between two vias to be located at the "bottom" of the via, which may reduce reflections in the via. This may also enable the output of such a capacitor to be located on any layer that is desired by other aspects of the PCB design. In other words, this may provide flexibility in implementing the capacitor within the PCB in a way that comports with PCB wiring restrictions and minimizes the effect on PCB physical design.

In some embodiments, each concave side of the capacitor may contain an input electrode that is connected to each stack of plates. These input electrodes may take the form of strips of conductive material that electrically connect to the plated barrel of a via that interfaces with that concave side of the capacitor. Each input electrode may be connected to an input set of plates (also referred to as the input "fingers") in one of the stacks of plates of the capacitor. Thus, a first concave side may provide the electrical input for one of the stacks of plates (from the first via), and a second concave side may provide the electrical input for the other stack of plates (from the second via).

This may enable the capacitor to be located between two vias directly underneath a component, where vias would typically be necessary anyway for signals to escape from the component. In some embodiments, therefore, this could reduce the amount of wiring turns necessary to route a signal through a capacitor to zero. Thus, in addition to resulting in wiring flexibility and reduced footprint, this could also result in significantly higher signal integrity.

FIGS. 1A through 1D illustrate a set of views of a capacitor 100 that may be embedded between two vias below a surface-mount component. FIG. 1A illustrates a perspective view of the capacitor 100 with a convex surface 102 of the capacitor visible. Capacitor 100's housing also contains top surface 104, concave surface 106 and concave surface 108. Concave surfaces 106 and 108 may be shaped to correspond to the curves of two vias between which capacitor 100 may be inserted. Thus, concave surfaces 106 and 108 may both contain an input electrode that may conduct a signal from a via to a set of plates in the interior of capacitor 100. Convex surface 102 contains the capacitor's output electrodes 110 and 112. These electrodes may conduct a set of signals (e.g., a differentiated pair of signals) from a set of plates in the interior of capacitor 100 to a set of wires (e.g., a differentiated pair of stripline wires in an inner layer of the PCB) that may conduct the signals to their destinations.

Figure 1B:
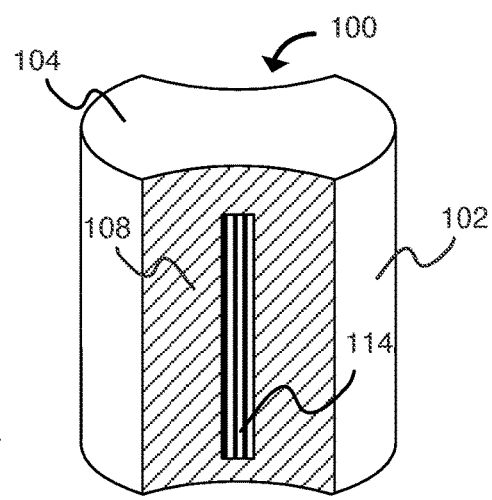
FIG. 1B depicts an alternative perspective view of the example embodiment of a capacitor that may be embedded between two vias below a surface-mount component, in accordance with embodiments of the present disclosure.

FIG. 1B illustrates an alternate perspective view of capacitor 100. FIG. 1B illustrates concave surface 108. Concave surface 108 contains input electrode 114. Input electrode 114, as discussed above, may conduct a signal from a via to a set of plates in the interior of capacitor 100. The signal may then transfer from the set of plates to output electrode 112, located on convex surface 102. While concave surface 106 is not visible in FIG. 1B, convex surface 106 may also contain an input electrode that is analogous to input electrode 114. The input electrode located on concave surface 106 may conduct a signal to output electrode 110 through a set of plates in the interior of capacitor 100.

Figure 1C:
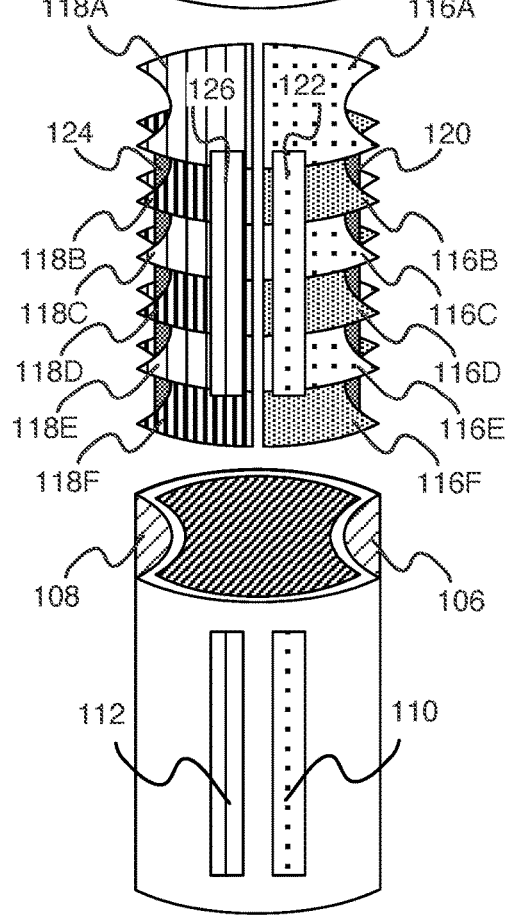
FIG. 1C depicts an exploded perspective view of the example embodiment of a capacitor that may be embedded between two vias below a surface-mount component, in accordance with embodiments of the present disclosure.

FIG. 1C illustrates an exploded perspective view of capacitor 100 to aid in the comprehension of capacitor 100's inner structure. As illustrated, capacitor 100 contains two stacks of quasi-semicircular parallel plates 116A-116F and 118A-118F. Because of the high surface area between the plates of a particular stack and the low surface area between plates of opposite stacks, as illustrated, parallel plates 116A-116F would capacitively couple to each other and not to parallel plates 118A-118F. Thus, if parallel plates 116A-116F were connected to one input and one output and parallel plates 118A-118F were connected to a complementary input and a complementary output, capacitor 100 could carry two differentiated AC signals (e.g., a differentiated pair of signals) in capacitor 100's quasi-circular footprint. While not illustrated in FIG. 1C for the sake of clarity, in some embodiments a high-dielectric-constant substrate (e.g., ceramic) may be positioned between the plates.

As illustrated, parallel plates 116A-116F are interdigitated; common conductor 120 connects parallel plates 116B, 116D, and 116F. Common conductor 120 may be electrically connected to an input electrode on concave surface 106. That input electrode may conduct a signal from a via to common conductor 120, which may then conduct the signal to parallel plates 116B, 116D, and 116F. Parallel plates 116B, 116D, and 116F are capacitively coupled to parallel plates 116A, 116C, and 116E, and thus the signal would pass from parallel plates 116B, 116D, and 116F to parallel plates 116A, 116C, and 116E. Parallel plates 116A, 116C, and 116E may then conduct the signal to common conductor 122, which connects parallel plates 116A, 116C, and 116E. Common conductor 122 may then conduct the signal to output electrode 110.

Similarly, parallel plates 118A-118F are also interdigitated; common conductor 124 connects parallel plates 118B, 118D, and 118F. Common conductor 124 may be electrically connected to input electrode 114 located on concave surface 108. Thus, input electrode 114 may receive a signal from a via and conduct it to common conductor 124, which may conduct the signal to parallel plates 118B, 118D, and 118F. Parallel plates 118B, 118D, and 118F are capacitively coupled to parallel plates 118A, 118C, and 118E, which may be connected by common conductor 126. Thus, a signal may pass from parallel plates 118B, 118D, and 118F to common conductor 126 through parallel plates 118A, 118C, and 118E. Common conductor 126 may then conduct the signal to output electrode 112.

Figure 1D:
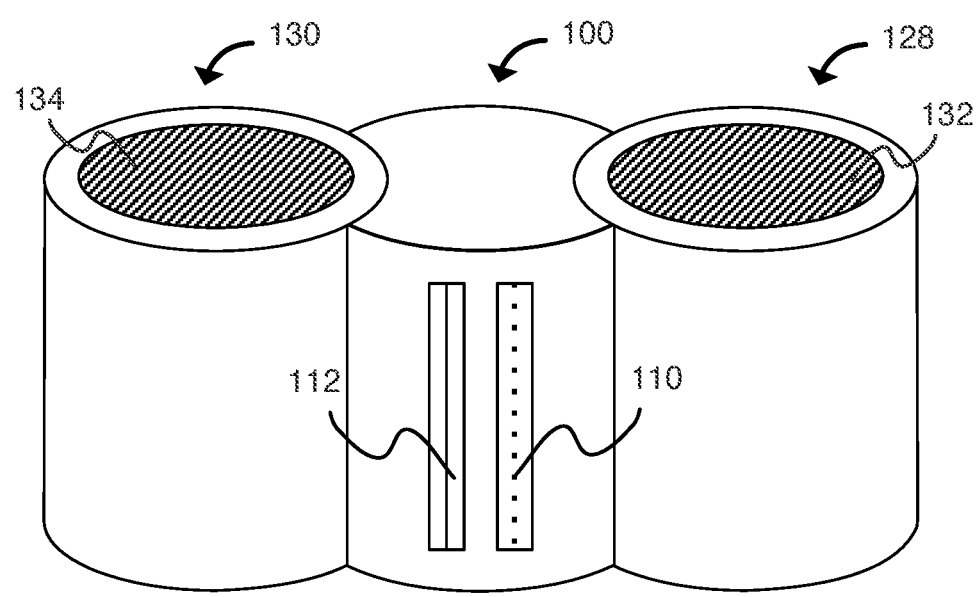
FIG. 1D depicts a perspective view of an example embodiment of the capacitor embedded between two vias, in accordance with embodiments of the present disclosure.

FIG. 1D illustrates a perspective view of capacitor 100 inserted between two vias 128 and 130 to aid in the comprehension of capacitor 100's inner structure. Plated barrel 132 of via 128 may receive an input signal from a surface component and conduct that signal to an input electrode of capacitor 100. Similarly, plated barrel 134 of via 130 may accept a signal from a surface component and conduct that signal to a second input electrode of capacitor 100 (e.g., input electrode 114. Those signals may pass through capacitor 100 and be conducted to a set of wires in the board (e.g., a differential pair of stripline wires in an inner layer of the PCB) through output electrodes 110 and 112.

Figure 2:
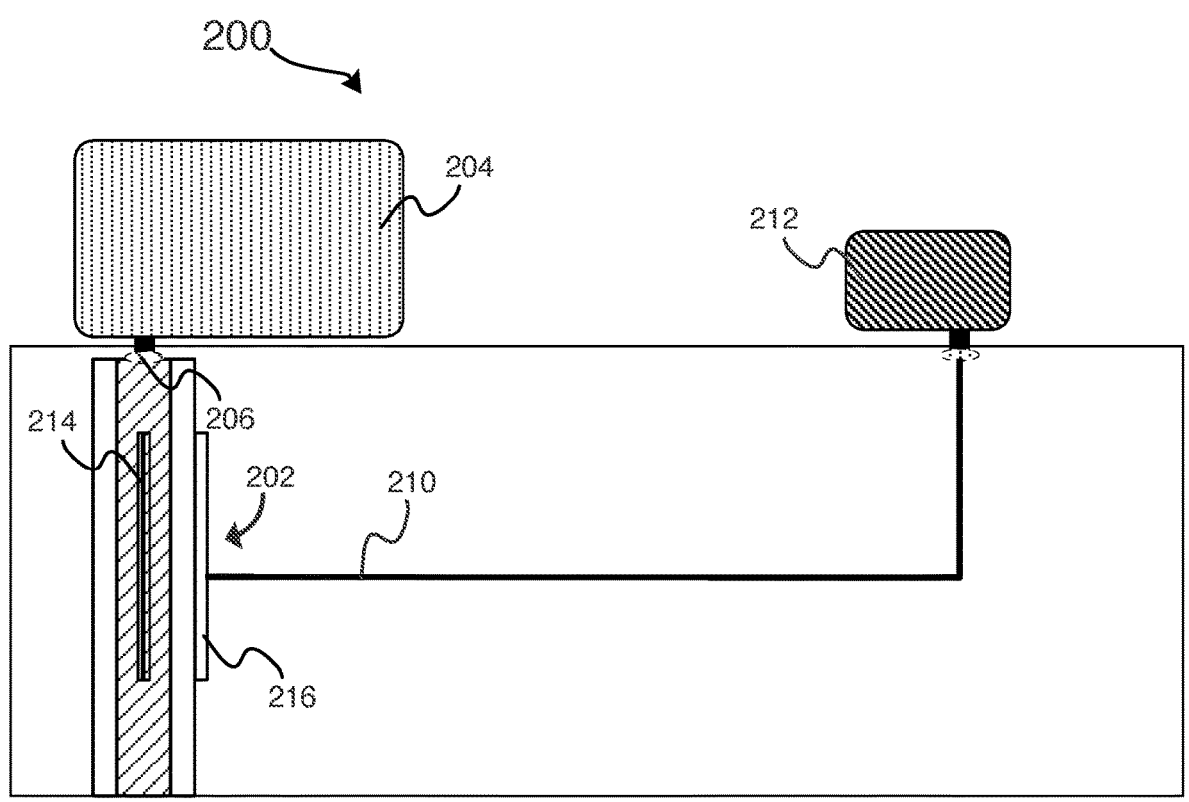
FIG. 2 depicts a capacitor embedded in a PCB below a surface-mount component, in accordance with the embodiments of the present disclosure.

FIG. 2 illustrates a printed-circuit-board assembly 200 that includes an embedded capacitor 202 that is inserted into a via directly below a surface-mount component 204. Surface mount component 204 (also referred to herein as "component 204") may output a differential pair of signals through contact pad 206 and a second contact pad (not shown herein for clarity), which may then pass those differential signals along the surfaces of the plated barrels of a pair of vias. Capacitor 202 may be inserted between those two vias. One via, for example, may accept an input signal from contact pad 206 and conduct that signal to input electrode 214 on a concave surface of capacitor 202. That signal may then exit capacitor 202 through output electrode 216 and enter stripline wire 210. Similarly, a corresponding differential signal may enter an input electrode on the opposite surface of capacitor 202 (i.e., opposite of input electrode 214) and be conducted to a second stripline wire through a second output electrode. Once underneath output component 212, stripline wire may turn up towards output component 212. This may be performed, for example, by passing the signal into a via underneath the component, which may then carry the signal to the component at the surface of the PCB.

As discussed, FIGS. 1A-1D and FIG. 2 illustrate a capacitor that can be inserted in a via directly below a component on a PCB surface. In some instances, however, it may not be beneficial, feasible, or possible to place a capacitor below the component from which the signal originates. In these instances, it may be necessary to embed the capacitor in the middle of the PCB. In these embodiments, it may be beneficial to embed an interdigitated capacitor within the PCB. Some embodiments of the present disclosure embed a cylindrical interdigitated capacitor within the internal layers of the PCB. In some embodiments, the interdigitated capacitor contains two stacks of semi-circular plates that are each divided into two sets. Each set may be connected to a separate common conductor, and each common conductor may electrically connect to another conductor on the side of the cylindrical capacitor (or, in some embodiments, each common conductor may exit the capacitor on the side of the housing). In these embodiments, the conductor of one set of a stack may act as the input for the stack, and the conductor of the other set of the stack may act as the output for the stack. In some embodiments the common conductor for each set in each stack may extend the "height" of the capacitor, and therefore the inputs and outputs for the stacks (and thus the inputs and outputs of the capacitor) may be placed to connect to any inner wiring layer of the PCB without requiring the signal turning in a wire. This may be beneficial not only because it provides significant wiring flexibility, but also because it avoids a need to redirect a signal to a surface layer of the PCB to enter or exit the interdigitated capacitor.

Figure 3A:
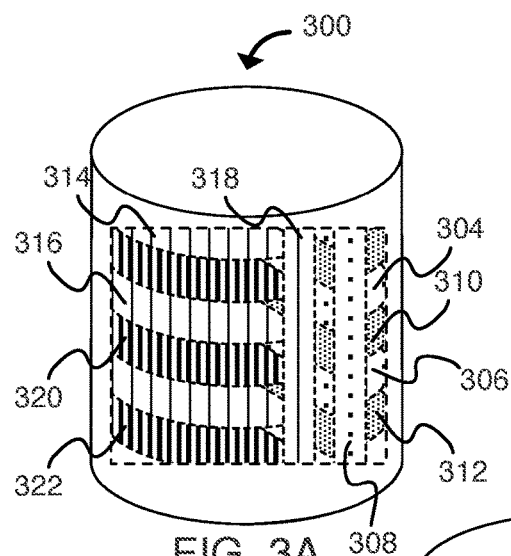
FIG. 3A depicts a perspective view of an example embodiment of an interdigitated capacitor that may be embedded in a via in a PCB, in accordance with embodiments of the present disclosure.
Figure 3B:
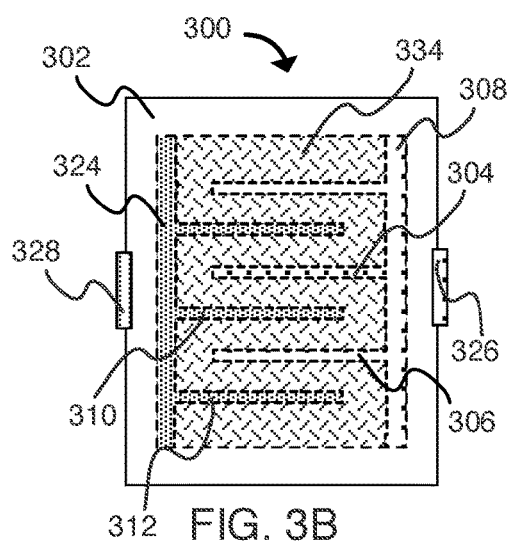
FIG. 3B depicts a side view of the example embodiment of an interdigitated capacitor that may be embedded in a via in a PCB, in accordance with embodiments of the present disclosure.
Figure 3C:
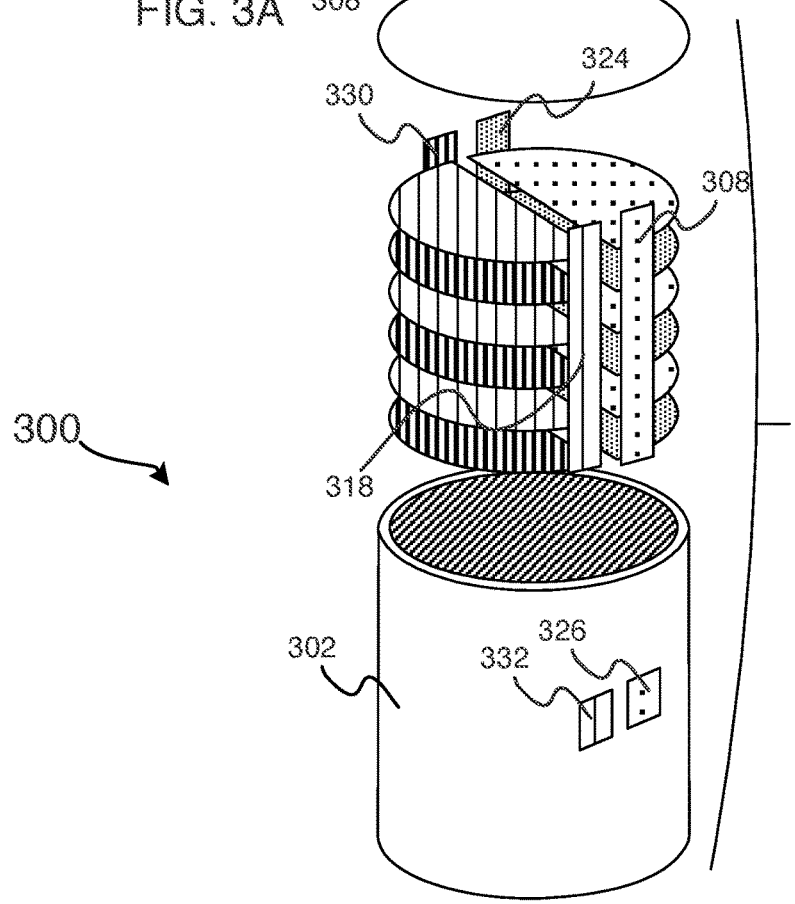
FIG. 3C depicts an exploded perspective view of the example embodiment of an interdigitated capacitor that may be embedded in a via in a PCB, in accordance with embodiments of the present disclosure.

FIGS. 3A-3C illustrate a set of views of capacitor 300 that may be embedded into a PCB via at various positions without requiring a signal to travel to the surface of the PCB. FIG. 3A illustrates a perspective view of capacitor 300 with the capacitor interior exposed through the capacitor's side wall 302. Capacitor 100 contains two stacks of parallel plates that act as interdigitated fingers. As illustrated, for example, plates 304 and 306 are electrically connected to common conductor 308, whereas plates 310 and 312 are electrically connected to a second common conductor (not illustrated in FIG. 3A, but illustrated as common conductor 324 in FIGS. 3B and 3C). Similarly, plates 314 and 316, for example, are electrically connected to a third common conductor 318, whereas plates 320 and 322 are electrically connected to a fourth common conductor (not illustrated in FIG. 3A, but illustrated as common conductor 330 in FIG. 3C).

FIG. 3B illustrates a side view of capacitor 300 with the capacitor interior exposed through the capacitor's side wall 302. FIG. 3B also illustrates the connection between plates 304 and 306 and common conductor 308, as well as the connection between plates 310 and 312 and common conductor 324. As discussed previously, the plates connected to common conductor 308 function as one large plate, whereas the plates connected to common conductor 324 function as a second large plate. Also visible in FIG. 3B is substrate 334, which may be a high-dielectric-constant substrate (e.g., quartz).

Common conductor 308 is electrically connected to electrode 326, whereas common conductor 324 is electrically connected to electrode 328. Electrode 328 may be connected to an inner-layer wire (e.g., a stripline wire) that is connected to a surface mount component (e.g., an input component). Electrode 326 may be connected to a different inner-layer wire that is connected to a different surface mount component (e.g., an output component). Thus, the plates connected to common conductor may be connectively coupled the capacitor is charged, and the two sets of plates may act as two large plates that are coupled together.

While electrodes 326 and 328 are situated approximately in the center of capacitor 300, in other embodiments electrodes 326 and 328 could be located at any height of capacitor 300, and thus could be designed to connect to any wire layer. Further, in some embodiments electrodes 326 and 328 may be located at different heights, and thus may connect to different wire layers.

FIG. 3C illustrates an exploded perspective view of capacitor 300 to aid in the comprehension of capacitor 300's inner structure. All parallel plates are visible in FIG. 3C, for example, as are all four common conductors 308, 318, 324, and 330. Common conductors 308, 318, 324, and 330 are connected to the parallel plates that match the fill patterns of those common conductors. The plates connected to common conductor 308 are capacitively coupled to the plates connected to common conductor 324, and thus a signal may travel from common conductor 324 to common conductor 308 through the coupled plates. Similarly, the plates connected to common conductor 318 are capacitively coupled to the plates connected to common conductor 330, and thus a signal may travel from common conductor 330 to common conductor 318 through the coupled plates. Also visible are the locations of electrodes 326 and 332 on side surface 302. As discussed, electrode 326 is electrically connected to common conductor 308. Electrode 332 is electrically connected to common conductor 318. Together, electrodes 326 and 332 may form a differential output pair. In other words, electrodes 326 and 332 may output a pair of complementary differential signals to a pair of differential wires. The differential signals may then travel through those differential wires to a component the surface of a PCB in which capacitor 300 is embedded.

Figure 4:
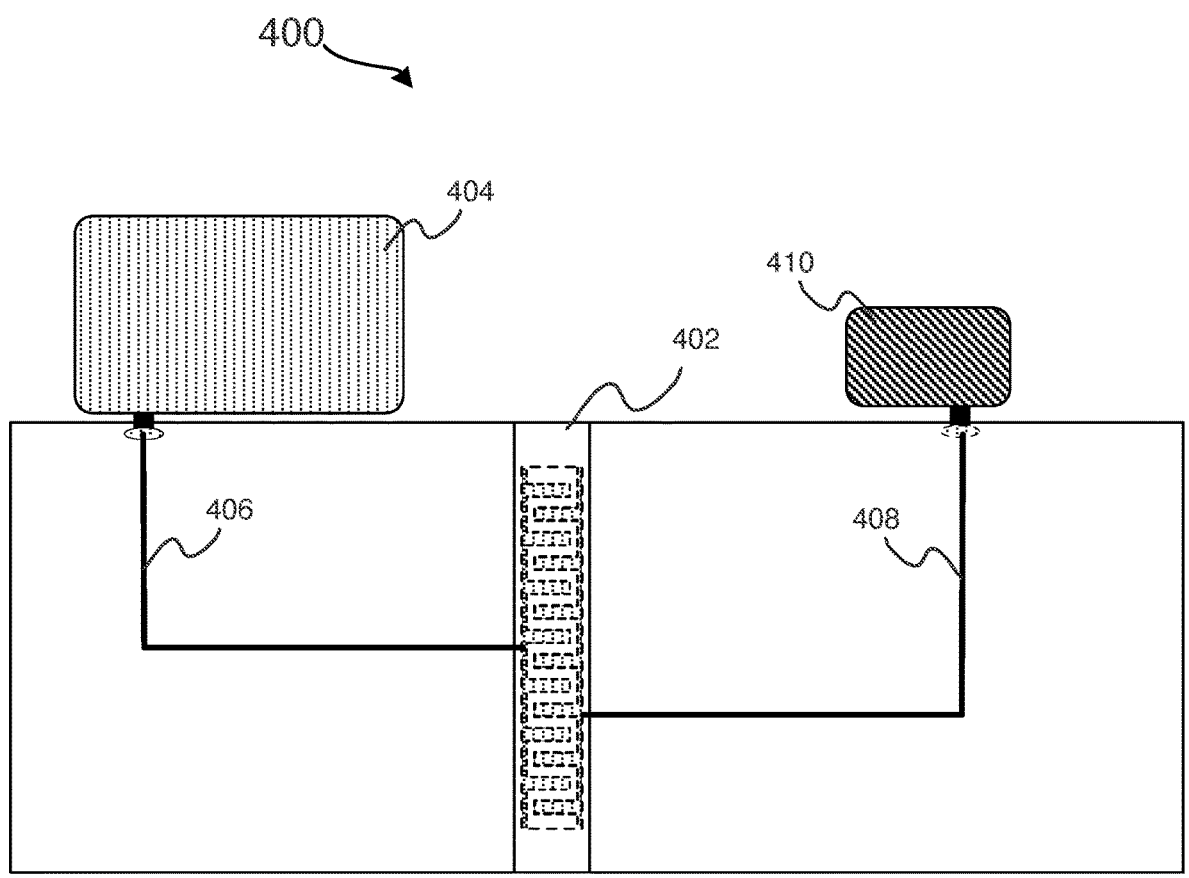
FIG. 4 depicts an interdigitated capacitor embedded in a via, in accordance with the embodiments of the present disclosure.

FIG. 4 illustrates a printed-circuit-board assembly 400 that includes an embedded interdigitated capacitor 402 that is inserted in a via of the PCB. Surface-mount component 404 (also referred to herein as "component" 404) is electrically coupled to capacitor 402 through carrier 406. In some embodiments, the portion of wire 406 that travels vertically through the PCB may actually take the form of a signal passing through an electroplated via. Horizontal portion of carrier 406, on the other hand, may take the form of a stripline wire. In some embodiments, carrier 406 may actually carry two complementary signals (e.g., a differentiated signal pair.

Carrier 406 may be electrically connected to one or more common conductors in capacitor 402. These common conductors, for example, may connect to a first and second stack of interdigitated plates that are coupled with a third and fourth stack of interdigitated plates respectively. The third and fourth stacks of interdigitated plates may be electrically connected to a matching set of common conductors, which may then electrically connect to carrier 408. Similar to carrier 406, carrier 408 may take the form of a stripline wire (or a pair of stripline wires) and a via. A signal (or a pair of differentiated signals) may travel through carrier 408 to output component 410.

Figure 5:
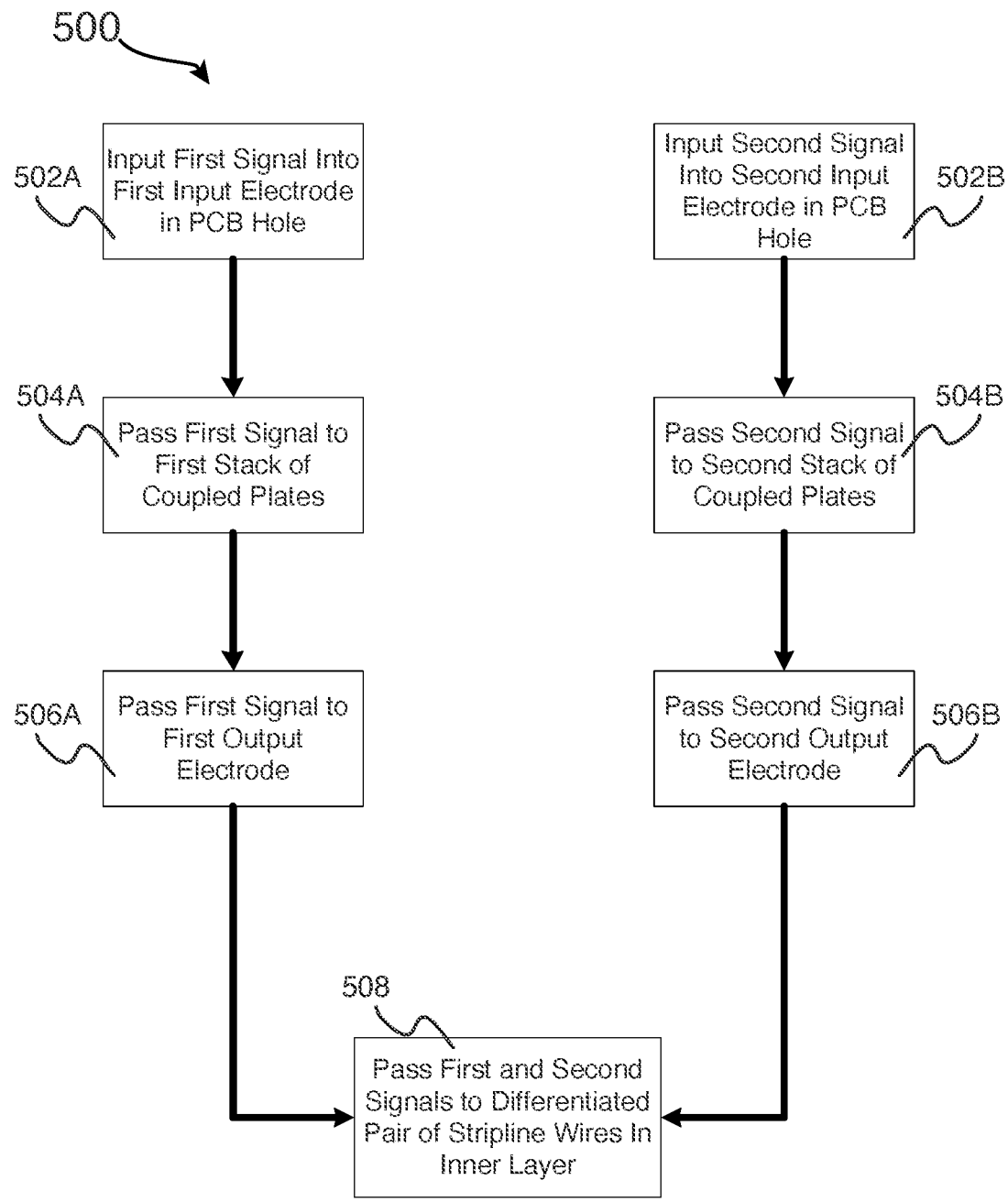
FIG. 5 depicts the representative major components of a computer system that may be used in accordance with embodiments.

As discussed previously, the embodiments of the present disclosure can be used to pass a differentiated pair of signals through a via-embedded capacitor and output the differentiated signal pair directly to a stripline wire in a PCB's inner layer. FIG. 5 discloses such a method 500 of using a via embedded capacitor to output a pair of signals to a pair of stripline wires. Method 500 begins with blocks 502A and 502B, in which a first and second signal (e.g., a pair of differentiated signals) are input into first and second input electrodes on a PCB-embedded capacitor. These input electrodes may be, in some embodiments, located on opposite concave surfaces of the capacitor. In these embodiments, the capacitor may be located between two vias directly below the surface-mount component providing the signals. In some other embodiments, the input electrodes may be, on the same convex surface of the capacitor, and may connect to two common carriers within the capacitor.

In blocks 504A and 504B, the first and second signals are passed to a first and second stack of plates within the capacitor. These plates may be, for example, quasi-semicircular (similar to, for example, parallel plates 116A–116F of FIG. 1C) or semicircular (similar to, for example, parallel plates 304, 306, 110, and 312 of FIG. 3A). The plates within these stacks may be capacitively coupled due to the large surface area between the plates of a stack. However, the plates may not capacitively couple with the plates of the other stack due to the small surface area of the plates between stacks. In some embodiments, these stacks of plates may be interdigitated. In other words, the first stack of plates may be composed of a first set of plates that are connected to a first common carrier (e.g., an input carrier) and a second set of plates that are connected to a second common carrier (e.g., the output carrier). The plates of the first set may be coupled to the plates of the second set. Similarly, the second stack of plates may be composed of a third set of plates that are connected to a third common carrier (an input carrier) and a fourth set of plates that are connected to a fourth common carrier (an output carrier). The plates of the third set may be coupled to the plates of the fourth set.

In blocks 506A and 506B, the first and second signals are passed from the stacks of plates to a first and second output electrode. These output electrodes may be on the side of the capacitor and may electrically connect with an electroplated barrel of the via. Finally, in block 508, the first and second signals are passed to a differentiated pair of stripline wires in the inner layer. In some embodiments, this inner layer may be located at the same level as the first and second output electrodes. In these embodiments, the signals may be able to pass directly from the output electrodes to the stripline wires, preventing unnecessary turning and associated effects (e.g., signal reflections).

Throughout the descriptions of the embodiments of the present disclosure, some components are referred to as being "electrically connected" to other components. As used herein, "electrically connected" is intended to refer to a configuration in which electrons are intended to flow from one component to another, typically through a metallic, ohmic contact. For example, two components may be electrically connected if they are physically connected by an electrical conductor (e.g., wire or an electrode) or several electrical conductors (e.g., a component may be electrically connected to another component through an output electrode and a wire connected in series). If two components are not in physical contact they may still be electrically coupled, in which case a signal is capable of passing between the two components, even if the two components are not technically electrically connected. For example, two components may be electrically coupled (sometimes referred to herein as "capacitively coupled") if they are separated by a dielectric substrate that is charged to allow current to flow between the two components (e.g., as in a charged capacitor).

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:
1. A capacitor comprising:
a housing;

a first stack of parallel plates within the housing, wherein a first plate and a second plate in the first stack are capacitively coupled;

a first common conductor connected to a first set of plates in the first stack;

a second common conductor connected to a second set of plates in the first stack, wherein the plates of the first set are capacitively coupled with the plates of the second set, but not with other plates in the first set;

a second stack of parallel plates within the housing, wherein a third plate and a fourth plate in the second stack are capacitively coupled;

a third common conductor connected to a third set of plates in the second stack; and a fourth common conductor connected to a fourth set of plates in the second stack, wherein the plates of the third set are capacitively coupled with the plates of the fourth set, but not with the plates of the third set;

a first input electrode and a second input electrode;

a first output electrode and a second output electrode on a side surface of the capacitor; and a dielectric material located between each plate in the first stack and second stack;

wherein the first stack is not capacitively coupled with the second stack.

2. The capacitor of claim 1, wherein the first input electrode is on a first concave side surface of the housing and is electrically connected to the first stack, and the second input electrode is a second concave side surface of the housing and is electrically connected to the second stack.

3. The capacitor of claim 2, wherein all plates of the first stack are capacitively coupled and all plates of the second stack are capacitively coupled.

4. The capacitor of claim 1, wherein the first common conductor is electrically connected to the first input electrode, the second common conductor is electrically connected to the first output electrode, the third common conductor is electrically connected to the second input electrode, and the fourth common carrier is electrically connected to the second output electrode.

5. The capacitor of claim 1, wherein the first input electrode and second input electrode are located on a side surface of the capacitor.

* * * * *